(12) United States Patent
Prasad et al.

(10) Patent No.: US 8,319,550 B2
(45) Date of Patent: Nov. 27, 2012

(54) SWITCHED-CAPACITOR PROGRAMMABLE-GAIN AMPLIFIER

(75) Inventors: Ammisetti V. Prasad, Austin, TX (US); James R. Feddeler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/008,352

(22) Filed: Jan. 18, 2011

(65) Prior Publication Data
US 2012/0182067 A1 Jul. 19, 2012

(51) Int. Cl.
*H03F 1/02* (2006.01)
(52) U.S. Cl. .............. 330/9; 330/69; 330/302; 330/254; 330/278
(58) Field of Classification Search ................ 330/9, 69, 330/302, 254, 278, 51
See application file for complete search history.

(56) References Cited

U.S. PATENT DOCUMENTS

| | | | |
|---|---|---|---|
| 5,006,817 A | 4/1991 | Babanezhad | |
| 5,258,664 A * | 11/1993 | White | 327/91 |
| 5,574,457 A | 11/1996 | Garrity et al. | |
| 5,793,230 A | 8/1998 | Chu et al. | |
| 6,288,669 B1 | 9/2001 | Gata | |
| 6,509,746 B1 * | 1/2003 | Wang | 324/678 |
| 6,697,444 B1 * | 2/2004 | Iizuka et al. | 375/343 |
| 6,713,828 B1 | 3/2004 | Chavan et al. | |
| 6,819,280 B2 | 11/2004 | Huang et al. | |
| 6,822,744 B1 | 11/2004 | Fischer et al. | |
| 6,873,276 B2 | 3/2005 | Yang et al. | |
| 6,897,720 B2 * | 5/2005 | Fujimoto | 330/9 |
| 6,919,760 B2 * | 7/2005 | Ogita et al. | 330/9 |
| 6,940,342 B2 * | 9/2005 | Ramesh et al. | 330/9 |
| 6,967,611 B2 * | 11/2005 | Atriss et al. | 341/172 |
| 7,215,202 B2 * | 5/2007 | Al-Shyoukh et al. | 330/279 |
| 7,295,143 B2 * | 11/2007 | Ambo et al. | 341/172 |
| 7,449,950 B2 | 11/2008 | Ivanov | |
| 7,518,439 B1 * | 4/2009 | Fong | 330/9 |
| 2005/0078026 A1 | 4/2005 | Cai | |
| 2007/0001757 A1 | 1/2007 | Josefsson | |
| 2009/0205436 A1 | 8/2009 | Garverick et al. | |
| 2011/0279148 A1 * | 11/2011 | Watanabe | 327/96 |

OTHER PUBLICATIONS

Enz et al.; "Circuit Techniques for Reducing the Effects of Op-Amp Imperfections: Autozeroing, Correlated Double Sampling, and Chopper Stabilization"; Proceedings of the IEEE; Nov. 1996; pp. 1584-1614; vol. 84, No. 11; IEEE.

* cited by examiner

*Primary Examiner* — Patricia Nguyen
(74) *Attorney, Agent, or Firm* — James L. Clingan, Jr.; Joanna G. Chiu

(57) ABSTRACT

A programmable-gain amplifier has a first input node coupled to receive a first input signal and a control input coupled to receive a gain select signal. The programmable-gain amplifier includes a differential amplifier having a first input and a first output and a plurality of capacitors. A first terminal of each of the plurality of capacitors is coupled to the first input of the differential amplifier, and a second terminal of each of the plurality of capacitors is coupled to the first input node during a sampling phase of the programmable-gain amplifier and selectively coupled to the first output of the differential amplifier, based on the gain select signal, during a gain phase of the programmable-gain amplifier.

17 Claims, 2 Drawing Sheets

SWITCHED-CAPACITOR PROGRAMMABLE-GAIN AMPLIFIER

BACKGROUND

1. Field

This disclosure relates generally to programmable-gain amplifiers, and more specifically, to switched-capacitor programmable-gain amplifiers.

2. Related Art

Amplifiers are commonly used in analog applications and frequently used in combination with other circuit types on the same integrated circuit. The applications vary widely and are often referenced as mixed signal applications when the magnitude of a signal can vary over continuum but the signal itself is clocked such as in sample and hold type of operation. Switched capacitor amplifiers are commonly used in the mixed signal situations. There are many applications where it is beneficial for the gain of the amplifier to be programmable. The typical issues of power and size extend to mixed signal circuits. Programmable-gain may include attenuation as well which is sometimes difficult to achieve.

Accordingly, it is desirable to provide a switched-capacitor programmable-gain amplifier that improves on one or more these issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an amplifier that is switched-capacitor and has programmable-gain includes a multiple capacitor array that provides for relatively high input impedance and operates to reduce power consumption of the amplifier and reduce the power of the circuit driving the amplifier and may be done with minimal if any additional space requirements. This is better understood by reference to the following description and the drawings.

Figure 1:
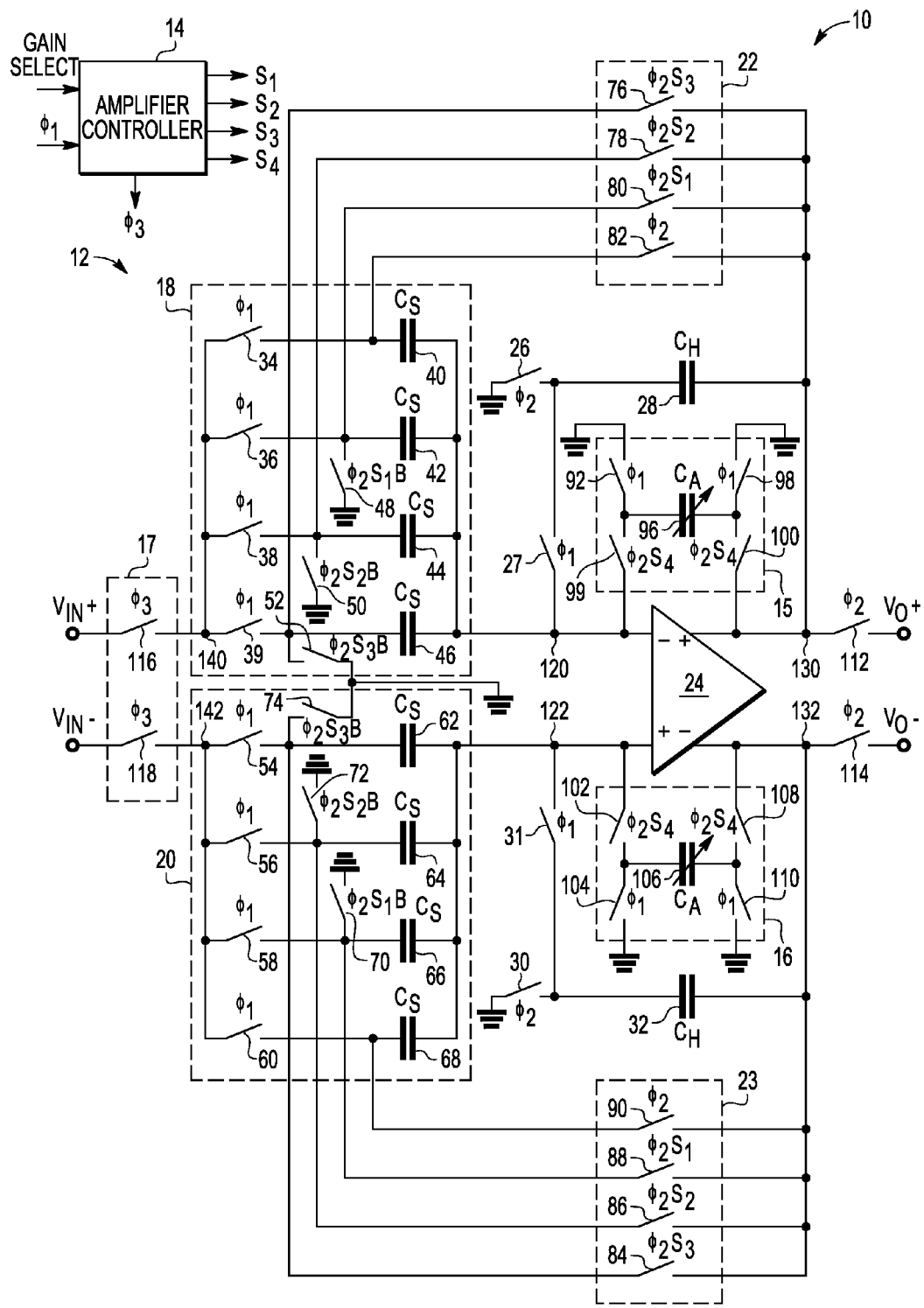
FIG. 1 is a circuit diagram of a switched-capacitor programmable-gain amplifier and a amplifier controller according to an embodiment.

Shown in FIG. 1 is a system 10 including an amplifier 12, which has programmable-gain and is a switched capacitor amplifier, and an amplifier controller 14. Controller 14 receives a gain select signal, which is multi-bit, and a clock signal, phase 1, shown as Ø1, and provides select signals S1, S2, S3, and S4 in response to the gain select signal and clock signal, phase 2 and phase 3, shown as Ø2 and Ø3, respectively, in response to phase 1. Phase 1 is a sampling phase. Phase 2, shown as Ø2, is a gain phase. Amplifier 12 includes an attenuation portion 15, an attenuation portion 16, an input portion 17, an input sample portion 18, an input sample portion 20, a gain select portion 22, a gain select portion 23, a differential amplifier 24, a switch 26 controlled by phase 2, a switch 27 controlled by phase 1, a capacitor 28, a switch 30 controlled by phase 2, a switch 31 controlled by phase 1, a capacitor 32, a switch 112 controlled by phase 2, and a switch 114 controlled by phase 2. Input sample portion includes switches 34, 36, 38, and 39 controlled by phase 1; capacitors 40, 42, 44, and 46; and switches 48, 50, and 52 controlled by phase 2. Input sample portion 20 includes switches 54, 56, 58, and 60 controlled by phase 1; capacitors 62, 64, 66, and 68; and switches 70, 72, and 74 controlled by phase 2. Gain select portion includes switches 76, 78, 80, and 82. Gain select circuit 23 includes switches 84, 86, 88, and 90. Attenuation circuit 15 includes switches 92 and 98 controlled by phase 1, switches 94 and 100 controlled by phase 2, and a variable capacitor 96. Attenuation circuit 16 includes switches 104 and 110 controlled by phase 1, switches 102 and 108 controlled by phase 2, and a variable capacitor 106. Input circuit 17 includes switches 116 and 118 controlled by phase 3. Differential amplifier 24 has a relatively high gain. Differential amplifier 24 also has a high impedance such the gates of MOS transistors. In this example, all of capacitors 40, 42, 44, 46, 62, 64, 66, 68, 28, and 32 have the same value within normal manufacturing variations. This is not required and different values may be chosen to achieve different gain selections.

Figure 2:
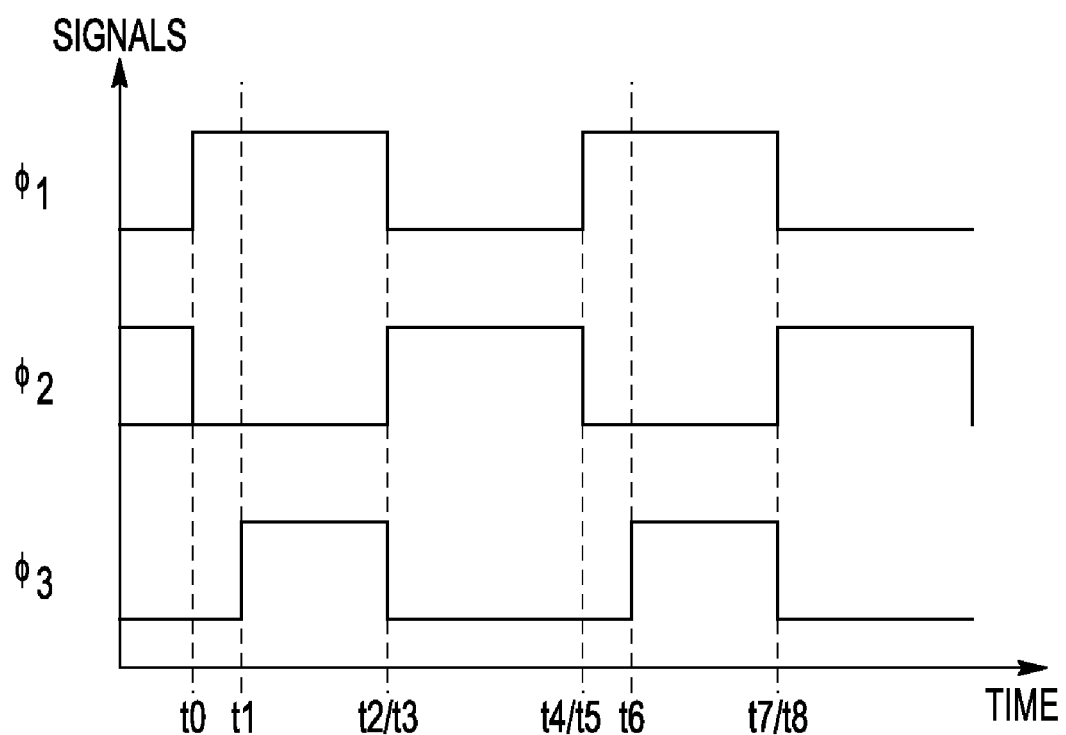
FIG. 2 is a timing diagram to aid in understanding the operation of the amplifier of FIG. 1.

Shown in FIG. 2 is a timing diagram showing phase 1, phase 2, and phase 3 in which at time t0 phase 1 becomes active as a logic high to begin a cycle. At a time t1 phase 3 becomes active at a logic high. At a subsequent time t2, both phase 1 and phase 3 become inactive at a logic low. At a subsequent time t3 but a time very close to time t2, phase 2 becomes active, followed by becoming inactive at a time t4. During operation, either phase 1 or phase 2 is active with minimal delay time in switching between these two phases. The next cycle begins at a time t5 when phase 1 becomes active. Phase 3 becomes active at time t6 followed by phases 1 and 3 becoming inactive at time t7. Phase 2 becomes active at time t8. Unless otherwise stated, switches that are controlled by phase 1 are closed during phase 1 being active and open otherwise, switches that are controlled by phase 2 are closed during phase 2 being active and open otherwise, and switches that are controlled by phase 3 are closed during phase 3 being active, and open otherwise. Phase 1 and phase 2 are 50% duty cycle clocks that are non-overlapping.

A first terminal of switch 116 receives an in input signal Vin+ that is an analog signal, and a first terminal of switch 118 receives an input signal Vin− which is an inversion of signal Vin+. The second terminal of switch 116 and first terminals of switches 34, 36, 38, and 39 are coupled to a node 140. The second terminal of switch 118 and first terminals of switches 54, 56, 58, and 60 are coupled to a node 142. Second terminals of switches 34, 36, 38, and 39 are coupled to first terminals of capacitors 40, 42, 44, and 46, respectively. Second terminals of switches 54, 56, 58, and 60 are coupled to first terminals of capacitors 62, 64, 66, and 68, respectively. Second terminals of capacitors 40, 42, 44, and 46 are coupled to a node 120. Second terminals of capacitors 62, 64, 66, and 68 are coupled to node 122. First terminals of switches 48, 50, and 52 are coupled to first terminals of capacitors 42, 44, and 46, respectively. First terminals of switches 70, 72, and 74 are coupled to first terminals of capacitors 66, 64, and 62, respectively. The second terminals of switches 48, 50, 52, 70, 72, and 74 are coupled to ground. First terminals of switches 76, 78, 80, and 82 are coupled to first terminals of capacitors 46, 44, 42, and 40, respectively. First terminals of switches 84, 86, 88, and 90 are coupled to first terminals of capacitors 62, 64, 66, and 68, respectively. Second terminals of switches 76, 78, 80, and 82 are coupled to a node 130. Second terminals of switches 84, 86, 88, and 90 are coupled to a node 132. An inverting input of differential amplifier 24 is coupled to node 120, a non-inverting input of amplifier 24 is coupled to node 122, an inverting output of differential amplifier 24 is coupled to node 132, and a non-inverting output of amplifier 24 is coupled to node 130. Switch 92 has a first terminal coupled to ground and a second terminal coupled to a first terminal of capacitor 96. Switch 98 has a first terminal coupled to ground and a second terminal coupled to a second terminal of capacitor 96. Switch 94 has a first terminal coupled to the first terminal of capacitor 96 and a second terminal coupled to node 120. Switch 100 has a first terminal coupled to the second terminal of capacitor 96 and a second terminal coupled to node 130. Switch 102 has a first terminal coupled to node 122 and a second terminal coupled to a first terminal of capacitor 106. Switch 108 has a first terminal coupled to node 132 and a second terminal coupled to a second terminal of capacitor 106. Switch 104 has a first terminal coupled to the first terminal of capacitor 104 and a second terminal coupled to ground. Switch 110 has a first terminal coupled to the second terminal of capacitor 106 and a second terminal coupled to ground. First terminals of switches 26 and 30 are coupled to ground. Second terminals of switches 26 and 30 are coupled to first terminals of capacitors 28 and 30, respectively. A first terminal of switch 27 is coupled to the second terminal of switch 26 and second terminal of switch 27 is coupled to node 120. A first terminal of switch 31 is coupled to node 122, and a second terminal of switch 31 is coupled to the second terminal of switch 30. Second terminals of capacitors 28 and 32 are coupled to nodes 130 and 132, respectively. First terminals of switches 112 and 114 are coupled to nodes 130 and 132, respectively. Second terminals of switches 112 and 114 provide output signals Vo+ and Vo−, respectively.

In operation nodes 120 and 122 are very near each other due to feedback. This is referenced as virtual ground. At the beginning of a cycle of operation initiated by phase 1 becoming active, first terminals of capacitors 40, 42, 44, and 46 are coupled together at node 140 by switches 34, 36, 38, and 39 being closed. Similarly, first terminals of capacitors 62, 64, 66, and 68 are coupled together at node 142 by switches 54, 56, 58, and 60 being closed. This places the voltage on the first terminals of capacitors 40, 42, 44, and 46 all at a first voltage and similarly places the voltage on the first terminals of capacitors 62, 64, 66, and 68 all at a second voltage. Phase 3 begins and couples the input Vin+ to node 140 and input Vin−, which is an analog inverse of Vin+, to node 142. Capacitors 40, 42, 44, and 46 are thus all charged to Vin+, and capacitors 62, 64, 66, and 68 are all charged to Vin−. During this time, switches 27, 31, 92, 98, 104, and 102 are closed so that capacitors 28 and 32 provide the feedback to keep nodes 120 and 122 at virtual ground and to keep capacitors 96 and 104 discharged. Phase 1 is terminated with phase 2 beginning after phase 1 has terminated. Switches 116 and 118 are opened to block input signals Vin+ and Vin− from nodes 140 and 142, respectively. Switches 34, 36, 38, and 39 are opened so that the first terminals of capacitors 40, 42, 44, and 46 are no longer coupled together. Similarly, switches 54, 56, 58, and 60 are opened so that the first terminals of capacitors 62, 64, 66, and 68 are no longer coupled together. Switches 27 and 31 are opened so that the first terminals of capacitors 28 and 32 are decoupled from nodes 120 and 122, respectively.

In response to entering phase 2, switches 26 and 30 couple the first terminals of capacitors 28 and 32 to ground. Amplifier controller 14 provides signals S1, S2, and S3 to determine which of capacitors 42, 44, and 46 are to have their first terminals coupled node 130 and which are to have their first terminals coupled to ground and determine which of capacitors 62, 64, and 66 are to have their first terminals coupled node 132 and which are to have their first terminals coupled to ground. The selected ones are coupled to node 130 or 132 and the deselected ones are coupled to ground. Signals S1, S2, and S3 are logically combined with phase 2 to achieve the desired condition for switches 48, 50, 52, 70, 72, 74, 76, 78, 80, 84, 86, and 88. These signals are shown as Ø2S1, Ø2S1B, Ø2S2, Ø2S2B, Ø2S3, and Ø2S3B. Switches 82 and 90 are always selected during phase 2 in this particular example. At least one capacitive coupling is needed between node 120 and node 130 during phase 2. This may be achieved by means other than always selecting the same capacitor for this function. For the case where S1 is active and S2 and S3, as well as S4 are inactive, signal S1 is combined with phase 2 to enable switches 80 and 88 and disable switches 48 and 70. Deselecting S2 and S3 results in switches 76, 78, 84, and 86 being inactive and switches 50, 52, 72, and 74 being active. The result is that the first terminal of capacitors 40 and 42 are coupled to node 130, the first terminal of capacitors 66 and 68 are coupled to node 132, the first terminal of capacitors 44 and 46 are coupled to ground, and the first terminal of capacitors 62 and 64 is coupled to ground. Capacitors 40 and 42 may be considered a selected subset of capacitors 40, 42, 44, and 46. Capacitors 44 and 46 may be considered an unselected subset of capacitors 40, 42, 44, and 46. The charge on capacitors 40 and 42 is thus coupled to node 130 and the charge on capacitors 66 and 68 is coupled to node 132. Capacitors 44, 46, 62, and 64 are discharged. In order to keep nodes 120 and 122 at virtual ground, amplifier 24 has to provide charge to capacitors 40 and 42 to offset the charge that discharged from capacitors 44 and 46. In this case the charge on capacitors 40, 42, 44, and 46 was the same just prior to phase 2 so that discharging two was equal to the charge on the two that were not discharge. Adding the needed charge to compensate for the amount discharged results in adding an equal amount to that already present which is doubling the charge. Doubling the charge on a capacitor doubles the voltage. The result then is that the voltage on node 130 after entering phase 2 becomes double that of the input voltage Vin+ that present on the first terminal of capacitors 40, 42, 44, and 46 prior to entering phase 2. The same principle applies for Vin− which present on the first terminals of capacitors 62, 64, 66, and 68 prior to entering phase 2. Upon entering phase 2, the amount of charge discharged from capacitors 62 and 64 gets added back to the first terminals of capacitors 66 and 68 in order to keep node 122 at virtual ground thus making node 132 double that of Vin− in the opposite direction from Vin+. Switches 112 and 114 are closed thus providing signals Vo+ and Vo− at double the separation of input signals Vin+ and Vin−. Thus, in this example, the gain is two.

Different gains can be obtained similarly by selecting none, 1, or three instead of two. In the case of selecting all three, there is none of the input capacitors are discharged so that the voltage on the first terminal of the capacitors remains the same for a gain of 1. If all three are selected, the amount discharged is three times that not discharged. Add the three to the one not discharged results in 4 and thus a gain of 4. In the case of 1 being selected, there is one discharged and three not discharged. The amount discharged is one third that not discharged so that the gain is one plus one third or 1⅓. The number of capacitors and switches can be increased to increase the number of different gains that may be selected. Also the capacitances can be varied to achieve the particular gains that are desired.

Attenuation is also available using attenuation portions 15 and 16. By selecting S4, capacitor 96, which was completely discharged immediately prior to phase 2, is coupled between nodes 120 and 130 during phase 2 and thus in parallel with capacitor 40 which is also coupled between nodes 120 and 130 during phase 2. This has the affect of sharing the charge over a greater capacitance and thus reducing the voltage. Thus for the case where all four capacitors 40, 42, 44, and 46 are selected for coupling to node 130, which is the unity gain case, capacitor 96 is added to the total capacitance and thus reducing the voltage by the ratio of the capacitances which is 4 to 5 which results an attenuation factor of 0.8.

Operationally, it is beneficial to have a phase 3 which delays the application of Vin+ and Vin− to capacitors while the voltage across the input capacitors is equalized. Also, because the voltage is adjusted to result in the charge on the capacitance applied between nodes 130 and 120 during phase 2 being the same as the charge on the input capacitors during phase 1, the equalization step results in the total charge on the input capacitors prior to phase 3 being the same as the charge arising from charging the capacitors to the previous Vin+. This has the affect of reducing the input impedance and thus the power requirements on the circuit that provides Vin+.

By now it should be appreciated that there has been provided a method of operating a programmable-gain amplifier which has a plurality of capacitors and a differential amplifier, wherein a first terminal of each of the plurality of capacitors is coupled to a minus input of the differential amplifier. The method includes receiving a gain select signal which indicates a selected subset of capacitors of the plurality of capacitors and an unselected subset of capacitors of the plurality of capacitors, wherein the selected subset includes at least one capacitor of the plurality of capacitors, and wherein the selected subset and the unselected subset are mutually exclusive. The method further includes, during a gain phase of the programmable-gain amplifier coupling the second terminal of each capacitor of the selected subset of capacitors indicated by the gain select signal to a plus output of the differential amplifier. When the unselected subset of capacitors includes at least one capacitor, coupling the second terminal of each capacitor of the unselected subset of capacitors to a first power supply terminal, wherein a gain of the programmable-gain amplifier is based on a ratio between a capacitance of the selected subset of capacitors and a capacitance of the unselected subset of capacitors. The method may further include, wherein the programmable-gain amplifier further comprises an attenuation capacitor, during the gain phase of the programmable-gain amplifier coupling a first terminal of the attenuation capacitor to the minus input of the differential amplifier and coupling a second terminal of the attenuation capacitor to the plus output of the differential amplifier, wherein the gain of the programmable-gain amplifier is attenuated based on a capacitance of the attenuation capacitor. The method may have a further characterization by which during the sampling phase of the programmable-gain amplifier, the second terminal of each of the plurality of capacitors is coupled to an input node of the programmable-gain amplifier prior to coupling the first input signal to the input node to couple the first input signal to the second terminal of each of the plurality of capacitors. The method may have a further characterization by which the first power supply terminal is further characterized as a ground terminal. The method may further comprise during the gain phase of the programmable-gain amplifier, decoupling the first input signal from the second terminal of each of the plurality of capacitors prior to the step of coupling the second terminal of each capacitor of the selected subset of capacitors indicated by the gain select signal to the plus output of the differential amplifier. The method may have a further characterization by which the programmable-gain amplifier includes a second plurality of capacitors, wherein a first terminal of each of the second plurality of capacitors is coupled to a plus input of the differential amplifier, and wherein the gain select signal indicates a second selected subset of capacitors of the second plurality of capacitors and a second unselected subset of capacitors of the second plurality of capacitors, wherein the second selected subset includes at least one capacitor of the second plurality of capacitors, and wherein the second selected subset and the second unselected subset are mutually exclusive and may further comprise during the sampling phase of the programmable-gain amplifier and coupling a second input signal to a second terminal of each of the second plurality of capacitors, wherein each of the second plurality of capacitors are coupled in parallel with each other; and during the gain phase of the programmable-gain amplifier coupling the second terminal of each capacitor of the second selected subset of capacitors indicated by the gain select signal to a minus output of the differential amplifier and when the second unselected subset of capacitors includes at least one capacitor, coupling the second terminal of each capacitor of the second unselected subset of capacitors to the first power supply terminal, wherein the gain of the programmable-gain amplifier is further based on a ratio between a capacitance of the second selected subset of capacitors and a capacitance of the second unselected subset of capacitors. The method may have a further characterization by which the programmable-gain amplifier further comprises a second attenuation capacitor and may further comprise during the gain phase of the programmable-gain amplifier coupling a first terminal of the second attenuation capacitor to the plus input of the differential amplifier and coupling a second terminal of the second attenuation capacitor to the minus output of the differential amplifier, wherein the attenuated gain of the programmable-gain amplifier is further based on a capacitance of the second attenuation capacitor. The method may have a further characterization by which during the sampling phase of the programmable-gain amplifier, the second terminal of each of the second plurality of capacitors is coupled to a second input node of the programmable-gain amplifier prior to coupling the second input signal to the second input node to couple the second input signal to the second terminal of each of the second plurality of capacitors.

Also disclosed is a programmable-gain amplifier having a first input node coupled to receive a first input signal and a control input coupled to receive a gain select signal. The programmable-gain amplifier further comprises a differential amplifier having a first input and a first output. The programmable-gain amplifier further comprises a plurality of capacitors. The programmable-gain amplifier has a further characterization by which a first terminal of each of the plurality of capacitors is coupled to the first input of the differential amplifier and a second terminal of each of the plurality of capacitors is coupled to the first input node during a sampling phase of the programmable-gain amplifier and selectively coupled to the first output of the differential amplifier, based on the gain select signal, during a gain phase of the programmable-gain amplifier. The programmable-gain amplifier may have a further characterization by which during the gain phase of the programmable-gain amplifier, the second terminal of any capacitor in the plurality of capacitors that is not coupled to the first output of the differential amplifier based on the gain select signal is coupled to a ground terminal. The programmable-gain amplifier may further comprise a first switch coupled between the second terminal of each of the plurality of capacitors and the first input node, wherein the first switches are conductive during the sampling phase and non-conductive during the gain phase, a second switch coupled between the second terminal of each of the plurality of capacitors and the first output of the differential amplifier, wherein each of the second switches is non-conductive during the sampling phase and selectively conductive during the gain phase based on the gain select signal, and a third switch coupled between the first input signal and the first input node, wherein when the third switch is conductive, the first input signal is provided to the first input node, wherein, during the sampling phase, the first switches are all made conductive prior to making the third switch conductive.

The programmable-gain amplifier may further comprise a holding capacitor having a first terminal coupled to the first output of the differential amplifier and a second terminal, wherein the second terminal is coupled to the first input of the differential amplifier during the sampling phase and is coupled to a ground terminal during the gain phase. The programmable-gain amplifier may further comprise an attenuating capacitor, wherein during the gain phase, the attenuating capacitor has a first terminal coupled to the first input of the differential amplifier and a second terminal coupled to the first output of the differential amplifier, wherein, during the gain phase, the attenuating capacitor attenuates a gain of the programmable-gain amplifier. The programmable-gain amplifier may have a further characterization by which the differential amplifier has a second input and a second output and may further comprise a second input node coupled to receive a second input signal and a second plurality of capacitors, wherein a first terminal of each of the second plurality of capacitors is coupled to the second input of the differential amplifier and a second terminal of each of the second plurality of capacitors is coupled to the second input node during the sampling phase of the programmable-gain amplifier and selectively coupled to the second output of the differential amplifier, based on the gain select signal, during the gain phase of the programmable-gain amplifier. The programmable-gain amplifier may have a further characterization by which during the gain phase of the programmable-gain amplifier, the second terminal of any capacitor in the second plurality of capacitors that is not coupled to the second output of the differential amplifier based on the gain select signal is coupled to a ground terminal. The programmable-gain amplifier may further comprise a first switch coupled between the second terminal of each of the second plurality of capacitors and the second input node, wherein the first switches are conductive during the sampling phase and non-conductive during the gain phase, a second switch coupled between the second terminal of each of the second plurality of capacitors and the first output of the differential amplifier, wherein each of the second switches is non-conductive during the sampling phase and selectively conductive during the gain phase based on the gain select signal, and a third switch coupled between the second input signal and the second input node, wherein when the third switch is conductive, the second input signal is provided to the second input node, wherein, during the sampling phase, the first switches are all made conductive prior to making the third switch conductive.

Disclosed also is a programmable-gain amplifier having a first input node coupled to receive a first input signal, a second input node coupled to receive a second input signal, and a control input coupled to receive a gain select signal. The programmable-gain amplifier further includes a differential amplifier having a minus input, a plus input, a plus output, and a minus output. The programmable-gain amplifier further includes a first plurality of capacitors. The programmable-gain amplifier has a further characterization by which. The programmable-gain amplifier may have a further characterization by which a first terminal of each of the first plurality of capacitors is coupled to the minus input of the differential amplifier, a second terminal of each of the first plurality of capacitors is coupled to the first input node during a sampling phase of the programmable-gain amplifier and selectively coupled to the plus output of the differential amplifier, based on the gain select signal, during a gain phase of the programmable-gain amplifier, and wherein, during the gain phase of the programmable-gain amplifier, the second terminal of any capacitor in the first plurality of capacitors that is not coupled to the plus output of the differential amplifier based on the gain select signal is coupled to a ground terminal, and a second plurality of capacitors, wherein a first terminal of each of the second plurality of capacitors is coupled to the plus input of the differential amplifier and a second terminal of each of the second plurality of capacitors is coupled to the second input node during the sampling phase of the programmable-gain amplifier and selectively coupled to the minus output of the differential amplifier, based on the gain select signal, during the gain phase of the programmable-gain amplifier, and wherein, during the gain phase of the programmable-gain amplifier, the second terminal of any capacitor in the second plurality of capacitors that is not coupled to the minus output of the differential amplifier based on the gain select signal is coupled to the ground terminal. The programmable-gain amplifier may further comprise a first switch coupled between the second terminal of each of the first plurality of capacitors and the first input node, wherein the first switches are conductive during the sampling phase and non-conductive during the gain phase, a second switch coupled between the second terminal of each of the first plurality of capacitors and the plus output of the differential amplifier, wherein each of the second switches is non-conductive during the sampling phase and selectively conductive during the gain phase based on the gain select signal, a third switch coupled between the first input signal and the first input node, wherein when the third switch is conductive, the first input signal is provided to the first input node, wherein, during the sampling phase, the first switches are all made conductive prior to making the third switch conductive, a fourth switch coupled between the second terminal of each of the second plurality of capacitors and a second input node, wherein the fourth switches are conductive during the sampling phase and non-conductive during the gain phase, a fifth switch coupled between the second terminal of each of the second plurality of capacitors and the first output of the differential amplifier, wherein each of the fifth switches is non-conductive during the sampling phase and selectively conductive during the gain phase based on the gain select signal, and a sixth switch coupled between the second input signal and the second input node, wherein when the sixth switch is conductive, the second input signal is provided to the second input node, wherein, during the sampling phase, the fourth switches are all made conductive prior to making the sixth switch conductive. The programmable-gain amplifier may further comprise a first attenuating capacitor, wherein during the gain phase, the first attenuating capacitor has a first terminal coupled to the minus input of the differential amplifier and a second terminal coupled to the plus output of the differential amplifier and a second attenuating capacitor, wherein during the gain phase, the second attenuating capacitor has a first terminal coupled to the plus input of the differential amplifier and a second terminal coupled to the minus output of the differential amplifier, wherein, during the gain phase, the first and second attenuating capacitors attenuate a gain of the programmable-gain amplifier.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a programmable-gain amplifier which has a plurality of capacitors, an attenuation capacitor, and a differential amplifier, wherein a first terminal of each of the plurality of capacitors is coupled to a minus input of the differential amplifier, the method comprising:
    receiving a gain select signal which indicates a selected subset of capacitors of the plurality of capacitors and an unselected subset of capacitors of the plurality of capacitors, wherein the selected subset includes at least one capacitor of the plurality of capacitors, and wherein the selected subset and the unselected subset are mutually exclusive;
    during a sampling phase of the programmable-gain amplifier:
        coupling a first input signal to a second terminal of each of the plurality of capacitors, wherein each of the plurality of capacitors are coupled in parallel with each other;
    during a gain phase of the programmable-gain amplifier:
        coupling the second terminal of each capacitor of the selected subset of capacitors indicated by the gain select signal to a plus output of the differential amplifier; and
        when the unselected subset of capacitors includes at least one capacitor, coupling the second terminal of each capacitor of the unselected subset of capacitors to a first power supply terminal, wherein a gain of the programmable-gain amplifier is based on a ratio between a capacitance of the selected subset of capacitors and a capacitance of the unselected subset of capacitors; and
    during the gain phase of the programmable-gain amplifier:
        coupling a first terminal of the attenuation capacitor to the minus input of the differential amplifier and coupling a second terminal of the attenuation capacitor to the plus output of the differential amplifier, wherein the gain of the programmable-gain amplifier is attenuated based on a capacitance of the attenuation capacitor.

2. The method of claim 1, wherein, during the sampling phase of the programmable-gain amplifier, the second terminal of each of the plurality of capacitors is coupled to an input node of the programmable-gain amplifier prior to coupling the first input signal to the input node to couple the first input signal to the second terminal of each of the plurality of capacitors.

3. The method of claim 1, wherein the first power supply terminal is further characterized as a ground terminal.

4. The method of claim 1, further comprising:
    during the gain phase of the programmable-gain amplifier, decoupling the first input signal from the second terminal of each of the plurality of capacitors prior to the step of coupling the second terminal of each capacitor of the selected subset of capacitors indicated by the gain select signal to the plus output of the differential amplifier.

5. The method of claim 1, wherein the programmable-gain amplifier includes a second plurality of capacitors, wherein a first terminal of each of the second plurality of capacitors is coupled to a plus input of the differential amplifier, and wherein the gain select signal indicates a second selected subset of capacitors of the second plurality of capacitors and a second unselected subset of capacitors of the second plurality of capacitors, wherein the second selected subset includes at least one capacitor of the second plurality of capacitors, and wherein the second selected subset and the second unselected subset are mutually exclusive, the method further comprising:
    during the sampling phase of the programmable-gain amplifier:
        coupling a second input signal to a second terminal of each of the second plurality of capacitors, wherein each of the second plurality of capacitors are coupled in parallel with each other;
    during the gain phase of the programmable-gain amplifier:
        coupling the second terminal of each capacitor of the second selected subset of capacitors indicated by the gain select signal to a minus output of the differential amplifier; and
        when the second unselected subset of capacitors includes at least one capacitor, coupling the second terminal of each capacitor of the second unselected subset of capacitors to the first power supply terminal, wherein the gain of the programmable-gain amplifier is further based on a ratio between a capacitance of the second selected subset of capacitors and a capacitance of the second unselected subset of capacitors.

6. The method of claim 5, wherein the programmable-gain amplifier further comprises a second attenuation capacitor, wherein the method further comprises:
    during the gain phase of the programmable-gain amplifier:
        coupling a first terminal of the second attenuation capacitor to the plus input of the differential amplifier and coupling a second terminal of the second attenuation capacitor to the minus output of the differential amplifier, wherein the attenuated gain of the programmable-gain amplifier is further based on a capacitance of the second attenuation capacitor.

7. The method of claim 5, wherein, during the sampling phase of the programmable-gain amplifier, the second terminal of each of the second plurality of capacitors is coupled to a second input node of the programmable-gain amplifier prior to coupling the second input signal to the second input node to couple the second input signal to the second terminal of each of the second plurality of capacitors.

8. The method of claim 5, wherein the first power supply terminal is further characterized as a ground terminal.

9. A programmable-gain amplifier having a first input node coupled to receive a first input signal and a control input coupled to receive a gain select signal, the programmable-gain amplifier comprising:

a differential amplifier having a first input and a first output;

a plurality of capacitors, wherein:
   a first terminal of each of the plurality of capacitors is coupled to the first input of the differential amplifier; and
   a second terminal of each of the plurality of capacitors is coupled to the first input node during a sampling phase of the programmable-gain amplifier and selectively coupled to the first output of the differential amplifier, based on the gain select signal, during a gain phase of the programmable-gain amplifier and;

an attenuating capacitor, wherein during the gain phase, the attenuating capacitor has a first terminal coupled to the first input of the differential amplifier and a second terminal coupled to the first output of the differential amplifier, wherein, during the gain phase, the attenuating capacitor attenuates a gain of the programmable-gain amplifier.

10. The programmable-gain amplifier of claim 9, wherein, during the gain phase of the programmable-gain amplifier, the second terminal of any capacitor in the plurality of capacitors that is not coupled to the first output of the differential amplifier based on the gain select signal is coupled to a ground terminal.

11. The programmable-gain amplifier of claim 9, further comprising:
   a first switch coupled between the second terminal of each of the plurality of capacitors and the first input node, wherein the first switches are conductive during the sampling phase and non-conductive during the gain phase;
   a second switch coupled between the second terminal of each of the plurality of capacitors and the first output of the differential amplifier, wherein each of the second switches is non-conductive during the sampling phase and selectively conductive during the gain phase based on the gain select signal; and
   a third switch coupled between the first input signal and the first input node, wherein when the third switch is conductive, the first input signal is provided to the first input node, wherein, during the sampling phase, the first switches are all made conductive prior to making the third switch conductive.

12. The programmable-gain amplifier of claim 9, further comprising:
   a holding capacitor having a first terminal coupled to the first output of the differential amplifier and a second terminal, wherein the second terminal is coupled to the first input of the differential amplifier during the sampling phase and is coupled to a ground terminal during the gain phase.

13. The programmable-gain amplifier of claim 9, wherein the differential amplifier has a second input and a second output, wherein the programmable-gain amplifier further comprises:
   a second input node coupled to receive a second input signal; and
   a second plurality of capacitors, wherein:
      a first terminal of each of the second plurality of capacitors is coupled to the second input of the differential amplifier, and
      a second terminal of each of the second plurality of capacitors is coupled to the second input node during the sampling phase of the programmable-gain amplifier and selectively coupled to the second output of the differential amplifier, based on the gain select signal, during the gain phase of the programmable-gain amplifier.

14. The programmable-gain amplifier of claim 13, wherein, during the gain phase of the programmable-gain amplifier, the second terminal of any capacitor in the second plurality of capacitors that is not coupled to the second output of the differential amplifier based on the gain select signal is coupled to a ground terminal.

15. The programmable-gain amplifier of claim 13, further comprising:
   a first switch coupled between the second terminal of each of the second plurality of capacitors and the second input node, wherein the first switches are conductive during the sampling phase and non-conductive during the gain phase;
   a second switch coupled between the second terminal of each of the second plurality of capacitors and the first output of the differential amplifier, wherein each of the second switches is non-conductive during the sampling phase and selectively conductive during the gain phase based on the gain select signal; and
   a third switch coupled between the second input signal and the second input node, wherein when the third switch is conductive, the second input signal is provided to the second input node, wherein, during the sampling phase, the first switches are all made conductive prior to making the third switch conductive.

16. A programmable-gain amplifier having a first input node coupled to receive a first input signal, a second input node coupled to receive a second input signal, and a control input coupled to receive a gain select signal, the programmable-gain amplifier comprising:
   a differential amplifier having a minus input, a plus input, a plus output, and a minus output; and
   a first plurality of capacitors, wherein:
      a first terminal of each of the first plurality of capacitors is coupled to the minus input of the differential amplifier, and
      a second terminal of each of the first plurality of capacitors is coupled to the first input node during a sampling phase of the programmable-gain amplifier and selectively coupled to the plus output of the differential amplifier, based on the gain select signal, during a gain phase of the programmable-gain amplifier, and wherein, during the gain phase of the programmable-gain amplifier, the second terminal of any capacitor in the first plurality of capacitors that is not coupled to the plus output of the differential amplifier based on the gain select signal is coupled to a ground terminal;
   a second plurality of capacitors, wherein:
      a first terminal of each of the second plurality of capacitors is coupled to the plus input of the differential amplifier, and
      a second terminal of each of the second plurality of capacitors is coupled to the second input node during the sampling phase of the programmable-gain amplifier and selectively coupled to the minus output of the differential amplifier, based on the gain select signal, during the gain phase of the programmable-gain amplifier, and wherein, during the gain phase of the programmable-gain amplifier, the second terminal of any capacitor in the second plurality of capacitors that is not coupled to the minus output of the differential amplifier based on the gain select signal is coupled to the ground terminal; and a first attenuating capacitor, wherein during the gain phase, the first attenuating capacitor has a first terminal coupled to the minus input of the differential amplifier and a second terminal coupled to the plus output of the differential amplifier; and a second attenuating capacitor, wherein during the gain phase, the second attenuating capacitor has a first terminal coupled to the plus input of the differential amplifier and a second terminal coupled to the minus output of the differential amplifier, wherein, during the gain phase, the first and second attenuating capacitors attenuate a gain of the programmable-gain amplifier.

17. The programmable-gain amplifier of claim 16, further comprising:

a first switch coupled between the second terminal of each of the first plurality of capacitors and the first input node, wherein the first switches are conductive during the sampling phase and non-conductive during the gain phase;

a second switch coupled between the second terminal of each of the first plurality of capacitors and the plus output of the differential amplifier, wherein each of the second switches is non-conductive during the sampling phase and selectively conductive during the gain phase based on the gain select signal;

a third switch coupled between the first input signal and the first input node, wherein when the third switch is conductive, the first input signal is provided to the first input node, wherein, during the sampling phase, the first switches are all made conductive prior to making the third switch conductive;

a fourth switch coupled between the second terminal of each of the second plurality of capacitors and a second input node, wherein the fourth switches are conductive during the sampling phase and non-conductive during the gain phase;

a fifth switch coupled between the second terminal of each of the second plurality of capacitors and the first output of the differential amplifier, wherein each of the fifth switches is non-conductive during the sampling phase and selectively conductive during the gain phase based on the gain select signal; and a sixth switch coupled between the second input signal and the second input node, wherein when the sixth switch is conductive, the second input signal is provided to the second input node, wherein, during the sampling phase, the fourth switches are all made conductive prior to making the sixth switch conductive.

* * * * *